United States Patent [19]
Smith et al.

[11] Patent Number: 5,039,862
[45] Date of Patent: Aug. 13, 1991

[54] SWITCHED ELECTRON BEAM SOURCE EMPLOYING A COMMON PHOTO-EMITTER CATHODE AND METHOD OF OPERATION

[76] Inventors: Donald O. Smith, 16 Dewey Rd., Lexington, Mass. 02173; Kenneth J. Harte, 64 Eastbrook Rd., Carlisle, Mass. 01741

[21] Appl. No.: 481,496

[22] Filed: Feb. 20, 1990

[51] Int. Cl.$^5$ .................. H01J 37/073; H01J 37/30
[52] U.S. Cl. ......................... 250/432 P; 250/492.2
[58] Field of Search ......... 250/423 P, 492.24, 492.23, 250/492.2

[56] References Cited

U.S. PATENT DOCUMENTS

| | | | |
|---|---|---|---|
| 4,460,831 | 7/1984 | Oettinger et al. | 250/492.2 |
| 4,820,927 | 4/1984 | Langner et al. | 250/492.2 |

Primary Examiner—Jack I. Berman
Attorney, Agent, or Firm—Charles W. Helzer

[57] ABSTRACT

A light switched electron beam source employing a common photo-emitter cathode and at least two light emitting sources of monochromatic light, such as laser diodes, light emitting diodes and the like. A light optical collimating and aperture sub-system transmits the light images from the two or more light emitting sources onto a prism or other optical element for diverting the path of the light images onto a common path. The common photo-emitting cathode is positioned in the common path for selective excitation by the respective light emitting sources. An electron optical subsystem is coupled to the output from the common photo-emitter cathode for collimating and further sharpening the electron beam pattern and for projecting it upon a target plane which may comprise an integrated circuit structure upon which patterns are to be written.

21 Claims, 4 Drawing Sheets

SWITCHED ELECTRON BEAM SOURCE EMPLOYING A COMMON PHOTO-EMITTER CATHODE AND METHOD OF OPERATION

FIELD OF INVENTION

This invention relates to a system for and method of selecting different shapes and orientations of electron emission patterns from a common photo-cathode selectively excited alternately by two or more monochromatic light emitting sources, such as diode lasers or light emitting diodes. The invention uses two or more such light sources selectively to form different shapes and orientations of squares and rectangles. The two light sources are electronically switched and their images so interlaced at the plane of a target surface so as to form elongated linear-shaped patterns that are at right angles to each other and spaced apart in the target plane.

BACKGROUND PRIOR ART

A method for producing variable electron beam spot sizes and shapes has been described by H. C. Pfeiffer in an article entitled "Variable Spot Shaping for Electron-Beam Lithography"—Journal of Vacuum Science Technology, Volume 15, 887 (1978) and to the application of such techniques to electron beam lithography. With respect to resolution and overlay accuracy, electron beam lithography is a superior method of writing integrated circuit patterns either directly on a semiconductor wafer or indirectly on glass or membranes for use as optical or x-ray masks. However, the use of electron lithography for direct write production of integrated circuits on a large commercial scale is limited by the relatively low rate at which features can be written compared to optical, or possibly in the future, x-ray lithography. The basic reason for this comparative speed disadvantages lies in the serial nature of writing pattern pixels with electron beams while optical patterning through a previously written mask is basically a parallel writing operation with many pixels written at one time.

In the extreme case of a finely focused Gaussian spot, an array of four by four Gaussian spots are typically required to generate the smallest feature of a desired electron beam pattern. This requirement arises due to the sharp edge width which is required in writing integrated circuit patterns.

An important improvement in speed of electron beam writing was made by H. C. Pfeiffer as reported in the above-noted 1978 article and which introduced a method of forming variable, different size electron beam spots with sharp edges and containing one or more pattern pixels.

A second step in improving the writing speed of electron beam lithography systems has been described in U.S. Pat. No. 4,390,789 for "Electron Beam Array Lithography System Employing Multiple Parallel Array Optic Channels", inventors—Donald O. Smith and Kenneth J. Harte and U.S. Pat. No. 4,694,178 for "Multiple Channel Electron Beam Optical Column Lithography System and Method of Operation", inventor—Kenneth J. Harte. In these prior patents, multiple electron beams are provided in the form of a multiplicity of separate, miniature electron beam optical columns arranged in configurations which increase the net writing speed on a workpiece by factors of ten to twenty. In order to be able to combine the advantage of variable spot shaping and multiple miniature electron beam optical columns, a miniaturized electrostatic spot shaper has been described in U.S. Pat. No. 4,683,366 for "All Electrostatic Electron Optical Sub-System for Variable Spot Shaping and Method of Operation", inventors—Kenneth J. Harte and Guenther O. Langner.

An important improvement in the performance of such miniature electron beam columns can be obtained by using photo-cathodes as described in U.S. Pat. No. 4,460,831 for "Laser Stimulated High Current Density Photo-Cathode Generator and Method of Manufacture", inventors—P. E. Oettinger and C. Lee, and in U.S. Pat. No. 4,820,927 issued Apr. 11, 1989 for "Electron Beam Source Employing a Photo-Emitter Cathode", inventors—Guenther O. Langner and Kenneth J. Harte. In these prior patents the use of a photo-emitting cathode excited by a diode laser light or a light emitting diode is described. The advantages of using such a photo-emitting cathode lies in the details of electron optical design and is described in these patents. In these prior art patents, however, a single diode laser or light emitting diode is used to excite each separate photo-emitter cathode.

SUMMARY OF INVENTION

It is a principal object of this invention to provide an improved, switched, electron beam source employing a common photo-emitter cathode and method of operation wherein two or more electronically switched diode lasers or light emitting diodes or the like are used to excite the same photo emissive cathode. In this way the rate of writing pixels in integrated circuit patterns with an electron beam lithography system may be increased. This method and apparatus is equally applicable to conventional single beam electron beam optical systems or to multiple beam systems such as are described in the above-cited prior art patents.

It is therefore a primary object of the present invention to make available an improved electronically operated light switched electron beam source employing two or more electronically switched sources of monochromatic light to excite the same common photo cathode in such a way as to increase the rate of writing pixels in integrated circuit patterns with electron beam lithography systems. The method and system is fully applicable for use with conventional single electron beam systems or multiple beam systems as will be described hereinafter.

In practicing the invention, a light switched electron beam source is provided employing a common photo-emitter cathode and comprising at least two light emitting sources; light optical collimating and image sharpening means are disposed in the path of the light that is projected by the respective light emitting sources for sharpening the edges of the light images projected by the sources; light path diverting means in the form of prisms, mirrors and the like are supplied with the light beams from the collimating and image sharpening means for diverting the path of light images from the respective light emitting sources onto a common path; and photo-emitting cathode means are positioned in the common path for selective excitation by the respective light emitting sources. Preferably, common control means are provided for selectively switching the respective diode lasers or the like on and off electronically.

The multiple light emitting sources are light emitting diodes, diode lasers and the like for emitting a finely focused pencil-like beam of monochromatic light. The light optical collimating and image sharpening means comprise a combined light collimator lens and aperture optical sub-system. In a typical lithographic application, the light emitting sources are designed to emit monochromatic light beams which are linear-shaped in cross section and which are oriented at right angles to each other at the apertures in the respective light collimator lens and aperture optical sub-system. The light apertures are similarly designed and disposed to respond to the linear cross-section light beam orientation of the respective light sources whereby one light beam has its elongated linear axis oriented to extend vertically and the remaining light beam extends in a horizontal pattern in the plane of the photo-emitting cathode means.

In preferred embodiments of the invention, the axes of the emitted light beam paths are displaced a finite distance apart relative to each other so as to separate the images of the two beams a finite distance apart in the plane of the photo-emitting cathode means to avoid stray light from one light beam from spilling over into the other beam and causing deterioration of beam edge sharpness. The light diverting means may comprise a prism, a mirror system and the like for bending the respective light beams onto a common path. The system further includes light focusing lens sub-systems interposed in the light path between the light path diverting means and the photo-emitting cathode for focusing respective light images onto the surface of the photo-emissive cathode.

In a preferred embodiment of the invention, the photo-emitting cathode comprises a photo-emissive film supported on a light-transparent substrate and the photo-cathode surface itself is patterned to expose photo-emissive surfaces in the form of horizontal and vertical lines only, corresponding in orientation to the orientation of the impinging linear cross-section light beams whereby the photo-emissive cathode functions as a switchable, apertured source.

In addition, the system further includes electron beam aperture means and electron beam selection deflection means for further controlling the width and length and sharpness of the electron writing beam produced by the light switched electron beam source. Lastly, the system further includes electron beam focusing and electron beam spot placement deflection electron optical sub-system for controlling the writing action of the electron beam spot in the plane of a workpiece, which in the preferred embodiment is conjugate to the apertured photocathode, as described in U.S. Pat. No. 4,820,927 by Langner and Harte for the case of a single light beam and aperture. The switched electron beam source and method of operation according to the invention can be used either in a conventional, single column electron beam lithography system or may be used in multiple electron beam lithography systems.

BRIEF DESCRIPTION OF DRAWINGS

These and other objects, features and many of the attendant advantages of this invention will be appreciated more readily as the same becomes better understood from a reading of the following detailed description, when considered in connection with the accompanying drawings, wherein like parts in each of the several figures are identified by the same reference characters, and wherein:

In FIG. 4, the light optical system of the light switched electron beam source is nearly "in line" in order to fit into the restricted space between different electron beam channels of a multiple electron beam system;

BEST MODE OF PRACTICING INVENTION

Figures 1, 1A, 1B, 1C, 1D:
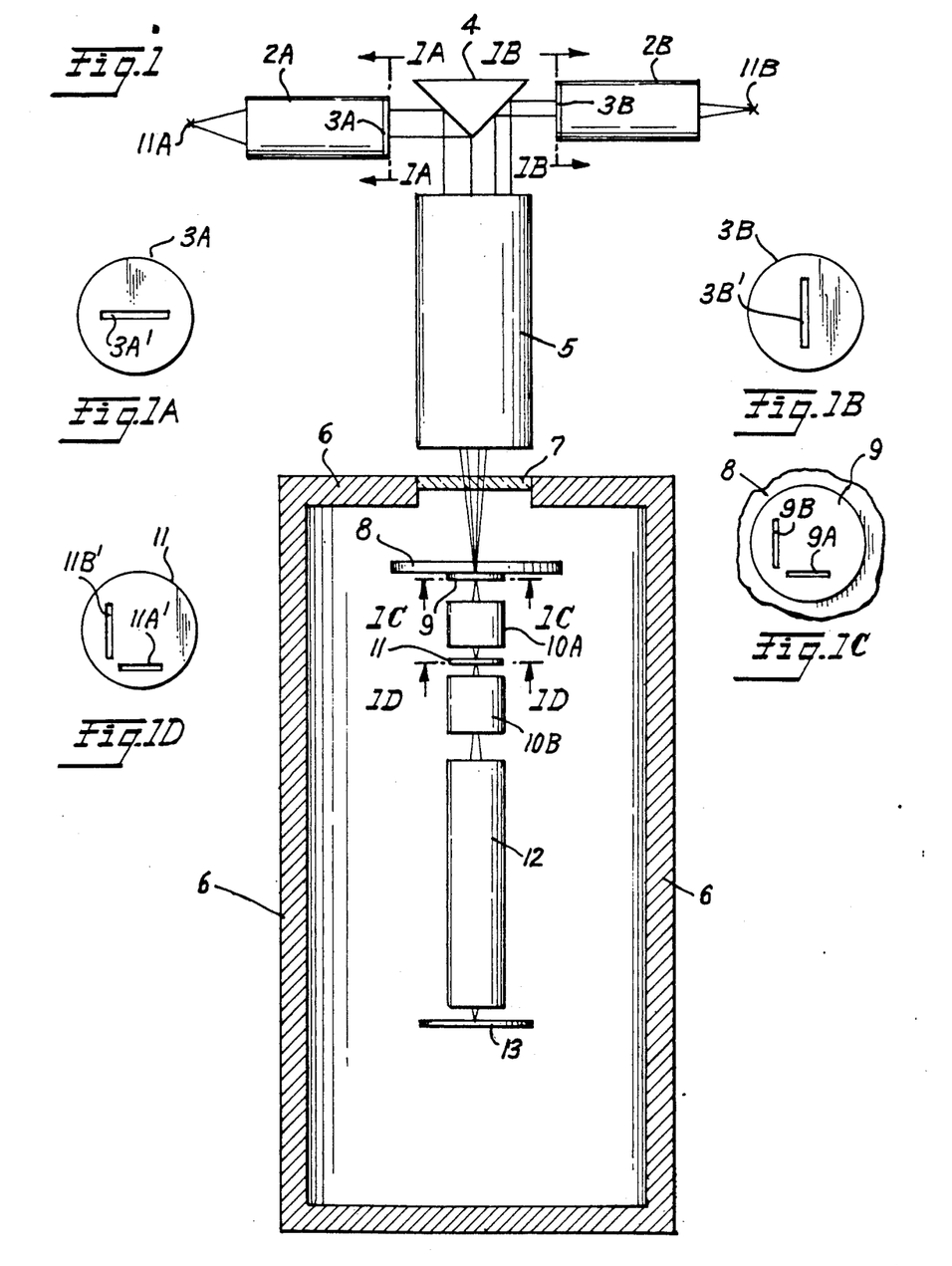
FIG. 1 is a schematic functional diagram of a light switched electron beam source method and system according to the invention suitable for use in a single electron beam lithography system.
FIGS. 1A, 1B, 1D and 1C illustrate the cross-sectional shapes of different beam sharpening apertures included in the overall electron beam source shown in FIG. 1.

FIG. 1 is a schematic, functional diagram of a single electron beam lithography system which employs a new and improved light switched electron beam source having at least two light sources and a common photo-emitter cathode according to the invention. In FIG. 1, elements 11A and 11B are two light emitting sources of monochromatic light such as diode lasers, light-emitting diodes and the like. The diode lasers 11A and 11B are oriented at right angles to each other such that the rectilinear optical emission patterns from such lasers are horizontal and vertical, respectively. Elements 2A and 2B are collimating light optical systems which collimate the diverging light from the respective diode lasers 11A and 11B into a finely focused, pencil-like beam of monochromatic light having a rectilinear cross-section. Elements 3A and 3B are apertured plates which form light optical apertures 3A' and 3B' that are placed in an optically conjugate plane to the final, focused light produced at element 9 and serve to sharpen the edges of the light source images from laser diodes 11A and 11B.

Element 4 is a reflecting prism which serves to bend and divert light from the sources 11A and 11B down to a common optical axis. Element 5 is a light optical focusing system which serves to focus the image of the apertures 3A' and 3B' onto the photo-emissive surfaces of a common photo-emissive cathode element 9. The details of construction and manner of operation of the common photo-cathode element 9 will be described more fully hereinafter with relation to FIG. 1C of the drawings.

Elements 10A and 10B form an electron optical shape and size selection sub-system which places the electron emission pattern from photo-cathode element 9 at selected locations on an electron optical apertured plate 11. Finally, element 12 is an electron optical focusing and deflection sub-system which focuses and places the electron beam that is further shaped and defined by the apertures in electron optical apertured plate 11 at the proper place on a workpiece 13 in order to write desired integrated circuit patterns on workpiece 13.

An electron beam lithography system used to write integrated circuit patterns must be able to write the smallest feature which occurs in the pattern. However, it is an important characteristic of such patterns that many of these small features are only small in one dimension, i.e. many small features are narrow long lines which form interconnecting conducting pathways between different parts of the integrated circuit.

It has long been recognized in electron beam lithography that the rate of writing patterned pixels with an electron beam could be increased if the writing beam "spot" could be formed into a narrow line instead of being restricted to being a square of the smallest required dimension. In fact, this is the reason that variable-shaped spots were introduced into electron beam lithography as reported in the above-noted article by H. S. Pfeiffer in the Journal of Vacuum Science and Technology. In actual integrated circuit patterns, the length to width ratio of lines varies over a wide range. In many cases, a line can be ten to one hundred times longer than it is wide. Consequently, in electron beam lithography, it is desirable to form the electron beam "spot" cross-sectional shape in as long as and as narrow pattern as possible.

Figure 6A:
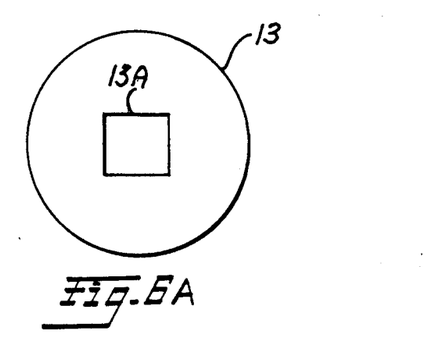
FIGS. 6A and 6B are schematic functional diagrams which illustrate how by means of prior art two square-shaped patterns are combined at an image plane such as the target surface of an integrated circuit wafer to form a single narrow line and help to illustrate one of the principal advantages of the present invention.
Figure 6B:
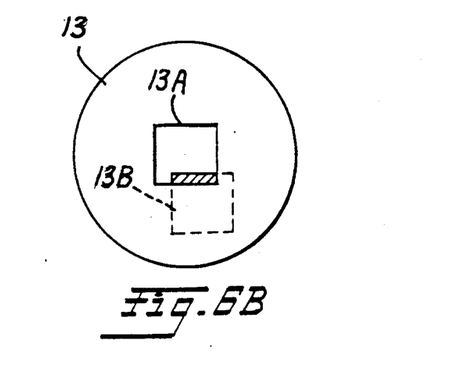

In the electron beam spot shapers described in the above-noted Pfeiffer article and in U.S. Pat. No. 4,683,366 to Harte and Langner, spot shaping is achieved by using variable over-lap between two focused images of square apertures as depicted in FIGS. 6A and 6B of the drawings. In this figure, the images of two square apertures 13A and 13B are pictured in overlapping, interlaced relationship so as to form either a vertical or a horizontal line since in real integrated circuits, interconnections must be provided in both directions.

The principal physical effect which limits the length of lines that can be obtained using the technique shown in FIG. 6B of the drawings, arises from electrostatic interactions between the electrons within the electron beam. For example, when the electrons are focused at aperture 11A' and 11B' in the system of FIG. 1 to form an image of these apertures the electrons of necessity come very close together. However, the electrostatic repulsive force between electrons tends to force them apart. Due to the random nature of individual electron positions within the beam there is a net non-refocusable broadening of the beam which results in fuzzy edges of the written features. This in effect increases the size of the smallest feature which can be written and limits resolution of the system. A method for reducing this effect suggests itself by noting in FIG. 6B that most of the electrons in the square spot which is formed at 13A and 13B, are not used to write the final narrow line. If these electrons could be eliminated, then the resultant space charge broadening would be reduced by a factor roughly equal to the ratio of the line length to the line width. It is the principal teaching of this invention to show how to do this using two or more switchable diode lasers to excite a common photo-emissive cathode through separate rectilinear-shaped apertures.

U.S. Pat. No. 4,460,831 for "Laser Stimulated High Current Density Photo-Cathode Generator and Method of Manufacture", inventors—P. E. Oettinger and C. Lee and U.S. Pat. No. 4,820,927 issued Apr. 11, 1989 for an "Electron Beam Source Employing a Photo-Emitter Cathode", inventors—G. O. Langner and K. J. Harte both disclose photo-emitter cathode systems which use only one diode laser to illuminate the photo-emissive cathode element of the system. In the present invention, instead of using only one diode laser to illuminate the photo-emissive cathode, the system of FIG. 1 shows the use of two diode lasers which selectively are switched on or off electronically to accomplish the above briefly-described purpose. Furthermore, it should be noted that because of the basic construction and mode of operation of diode lasers, such lasers are not a symmetrical source of light, but rather emit monochromatic light in the shape of a narrow line. In FIG. 1, the two laser diodes 11A and 11B are orientated at right angles to each other in order to form either a horizontal or a vertical pattern of light on the surface of the photo-cathode target 9 and thereby provide corresponding horizontal or vertical cross-sectional lines of electron emission. Either the horizontal or vertical line is selected by electronically switching between the two diodes.

In FIG. 1, the images of the two diodes 11A and 11B are combined by means of reflection from the faces of the prism 4 and are projected onto a common light path whose central axis is coincident with the central axis of the light optical focussing sub-system 5 and the succeeding electron-optical sub-system.

Laser diode 11A is oriented with its long emitted light beam axis perpendicular to the plane of the figure while the diode 11B is oriented with its long axis in the plane of the figure. Due to diffraction effects, the angle of emission in the direction along the emitting axis is typically about 30° while the angle from the ends of the axis is only about 10°. This effect is shown in FIG. 1 by the different emission angles from the lasers 11A and 11B.

The electron beam lithography system shown in FIG. 1 is composed of a light optical sub-system and an electron beam optical sub-system. The light optical sub-system shown in FIG. 1 consists of the two light emitting diodes or laser diodes 11A and 11B oriented at right angles to each other as shown at 3A' and 3B'; the collimating optical sub-systems 2A and 2B; the horizontal and vertical apertured plates 3A and 3B whose apertures 3A' and 3B' are at right angles relative to each other; the light path diverting prism 4; and the light focusing optical sub-system 5.

The function of each of the above-listed light optical elements is as follows:

Diode lasers 11A and 11B are the sources of switchable light which form either a horizontal or vertical line of light as depicted at 3A' and 3B' in FIGS. 1A and 1B.

Light collimators 2A and 2B and apertured plates 3A and 3B are provided in order to reduce cross talk between the horizontal and vertical final electron beam spot forming apertures 11A' and 11B' in apertured plate 11 of the electron beam optical sub-system. To do this it is necessary to sharpen the edges of the images of the diode emission on the surfaces of the photo-emissive cathode element 9. This is accomplished by placing apertured plates 3A and 3B in the path of the collimated light beams which emerge from the collimators 2A and 2B.

Prism 4 functions to reflect the two diode laser images down a common optical axis as shown in FIG. 1.

The vertical displacement of the optical axes of the two diode laser light emission paths as shown in FIG. 1, will be explained more fully hereinafter in connection with the following detailed description of the design of the electron beam apertures 9 and 11.

Light focusing sub-system 5 functions to focus the diode images onto the photo-emissive cathode surfaces of photo-cathode element 9.

The remaining elements shown in FIG. 1 not discussed in the preceding paragraph comprise the electron optical sub-system portion of the overall electron beam lithography system of FIG. 1. The electron optical sub-system forms the electron beam spot from the photo-emitted electrons produced by the photo-emissive surfaces of photo-cathode 9 and places this spot at the proper location on the target workpiece 13 to write a desired integrated circuit pattern. The design of the elements comprising the electron optical sub-system and their function is as follows:

The photo-cathode 9 is supported on a transparent substrate 8 and it is designed in such a manner that the electron emissive surfaces thereon are patterned to only expose photo-emissive surfaces in the form of horizontal and vertical lines as shown at 9A and 9B in FIG. 1C corresponding in size, shape and orientation to the light aperture images 3A' and 3B'. The patterning of the photo-cathode emissive surfaces in this manner produces a well-defined set of switchable, sharply apertured sources. The necessity for this additional aperturing arises if the electron beam is used to write features which are below the resolution limit of the light used to illuminate the photo-cathode 9. In many applications this will be the case. For example, if a gallium arsenide (GaAs) laser diode is used to match a GaAs photo-emitter, then the light has a wavelength in the infrared region at 800 NM. On the other hand, a preferred form of the electron beam lithography system would be to write integrated circuit patterns having minimum features of 200 NM. Even with large demagnification, such as 20×, this requirement is extremely difficult to achieve with optical imaging only. Hence, an aperture having edge resolution compatible with 200 NM features is required. This can be accomplished by forming a thin film pattern on the face of the photo-cathode as depicted at 9A and 9B in FIG. 1C. Note, that in order to have this required resolution, the pattern could best be written with an electron beam.

The electron beam apertured plate 11 and electron beam size and shape selection elements 10A and 10B function, in addition to the electron beam spot forming primary aperture 9, in order to be able to vary the width and length of a line. This is accomplished by means of the second aperture 11 and the selection deflection system 10A and 10B. The construction and operation of such a selection and deflection system for elements 10A and 10B has been described in detail in U.S. Pat. No. 4,820,927 to Langner and Harte, and reference is made to that patent for a more detailed description of their construction and operation.

The focusing and electron beam spot placement electron optic sub-system 12 has been described in detail in U.S. Pat. No. 4,694,178 to K. J. Harte and need not be described in further detail in this disclosure. It is only important to point out that the minor-field deflection system must now be programmed to include corrections for variations in the exact placement of the various elements of the patterns which appear on apertures 9 and 11 of FIG. 1. This does not entail additional electronic hardware beyond that already described in the above-cited patents, but does require additional calibration and correction software.

Figure 2:
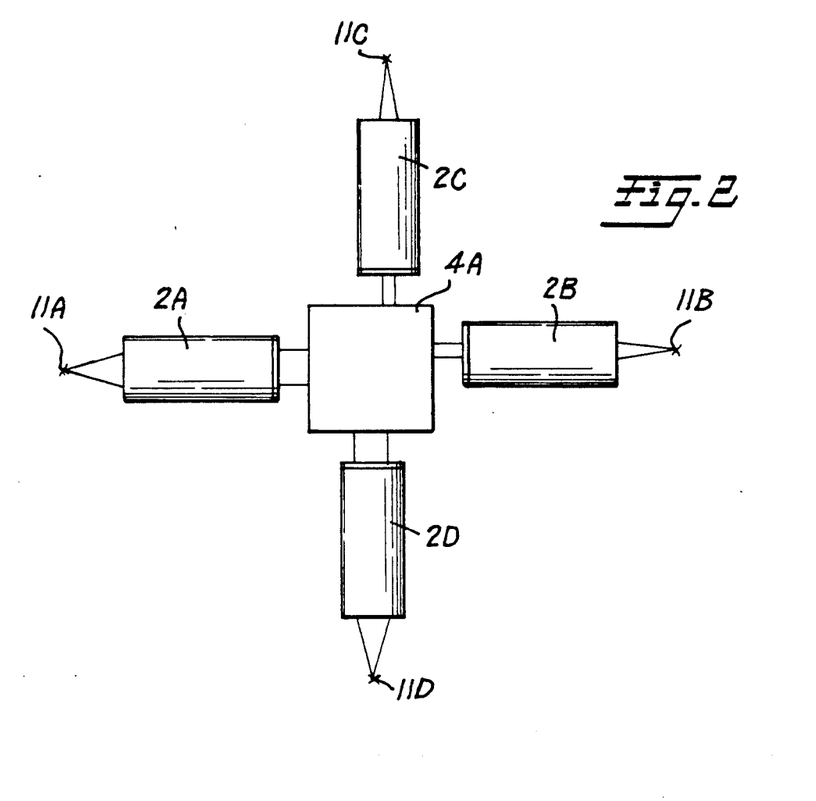
FIG. 2 illustrates the construction of an electron beam source according to the invention which employs four diode lasers to generate four different spot shapes and orientations as shown in FIGS. 3A and 3B of the drawings.
Figure 3A:
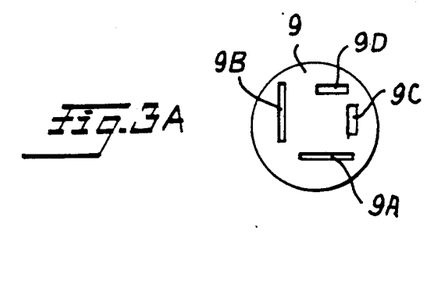
Figure 3B:
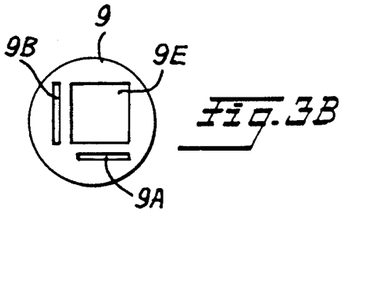

FIG. 2 shows an embodiment of the invention which uses four diode lasers 11A, 11B, 11C and 11D having a four-way acting double prism assembly 4A. FIG. 2 is a top view of the alternative system. With the system of FIG. 2, four different shapes and orientation of photo-emissive patterns can be developed as illustrated in FIGS. 3A and 3B. The horizontal and vertical lines shown in FIGS. 3A and 3B can be made to have different length to width ratios from the other two lines. Hence, a wider range of integrated circuit features can be matched to the exact size and shape of the electron beam produced using such a system. The net result is a further increase in the rate at which pattern pixels can be written. Of course, the exact menu of emission patterns which will maximize the pixel writing rate will also depend upon the particular integrated circuit patterns to be written. FIG. 3B shows a special menu of three emission patterns especially designed to accomplish the writing of small features.

Figure 4:
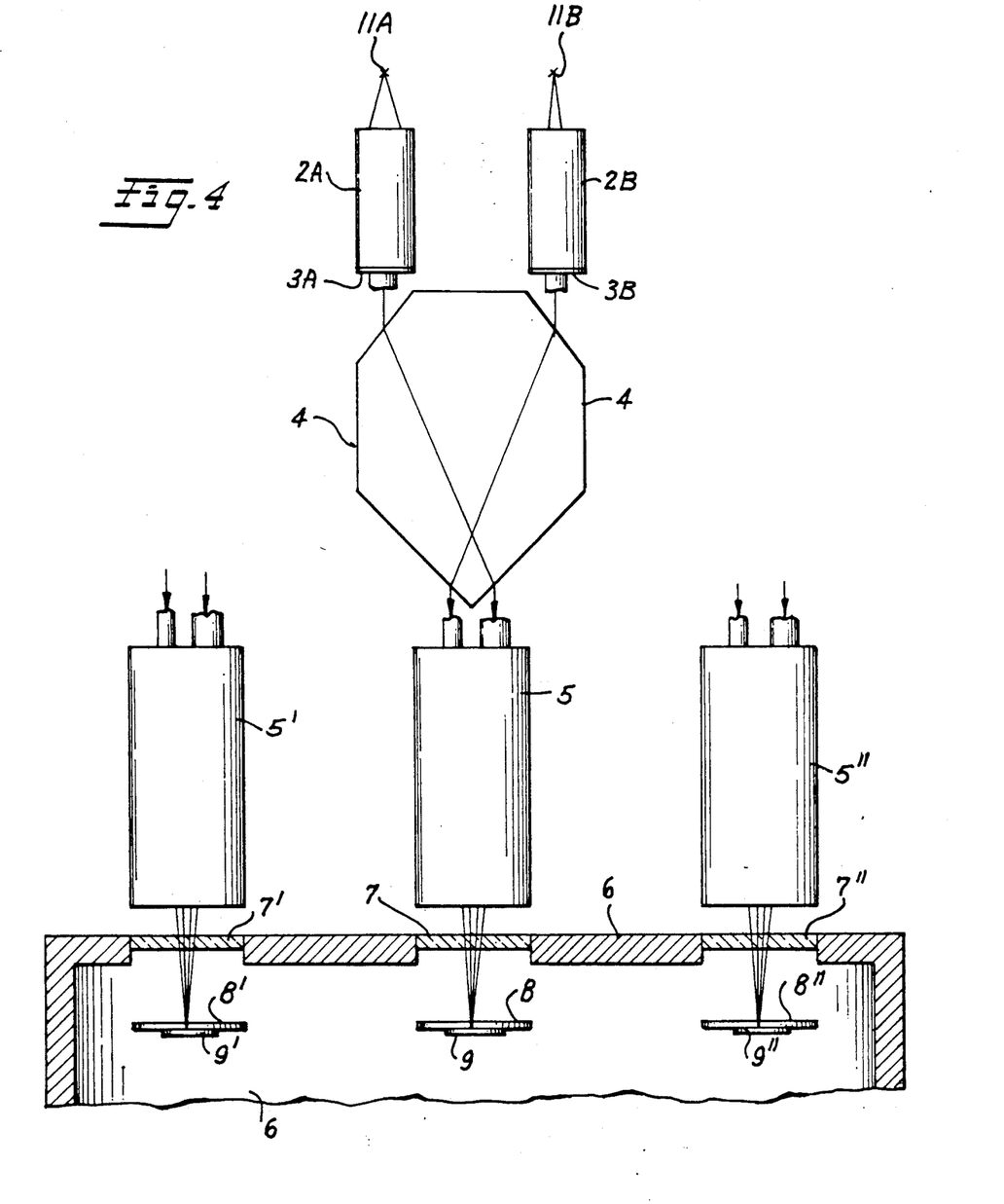
FIG. 4 is a schematic functional diagram of a light switched electron beam source according to the invention which is suitable for use in a multi-electron beam lithography system.

FIG. 4 shows a light optical sub-system design that is suitable for use in a multi-electron beam lithography system. In this design, the light optical system is nearly "in line" in order to fit into the restricted space between the several channels of a multiple electron-beam system. In FIG. 4, the elements of the light optical sub-system are identified with the same reference numerals used to identify corresponding elements in the system of FIG. 1, but have been either primed or double primed to show that they are separate light optical sub-systems. It will be seen that essentially the same functional components are used and co-act with the electron optical sub-system (not shown in FIG. 4) in substantially the same manner as shown and described in relation to FIG. 1.

Figure 5:
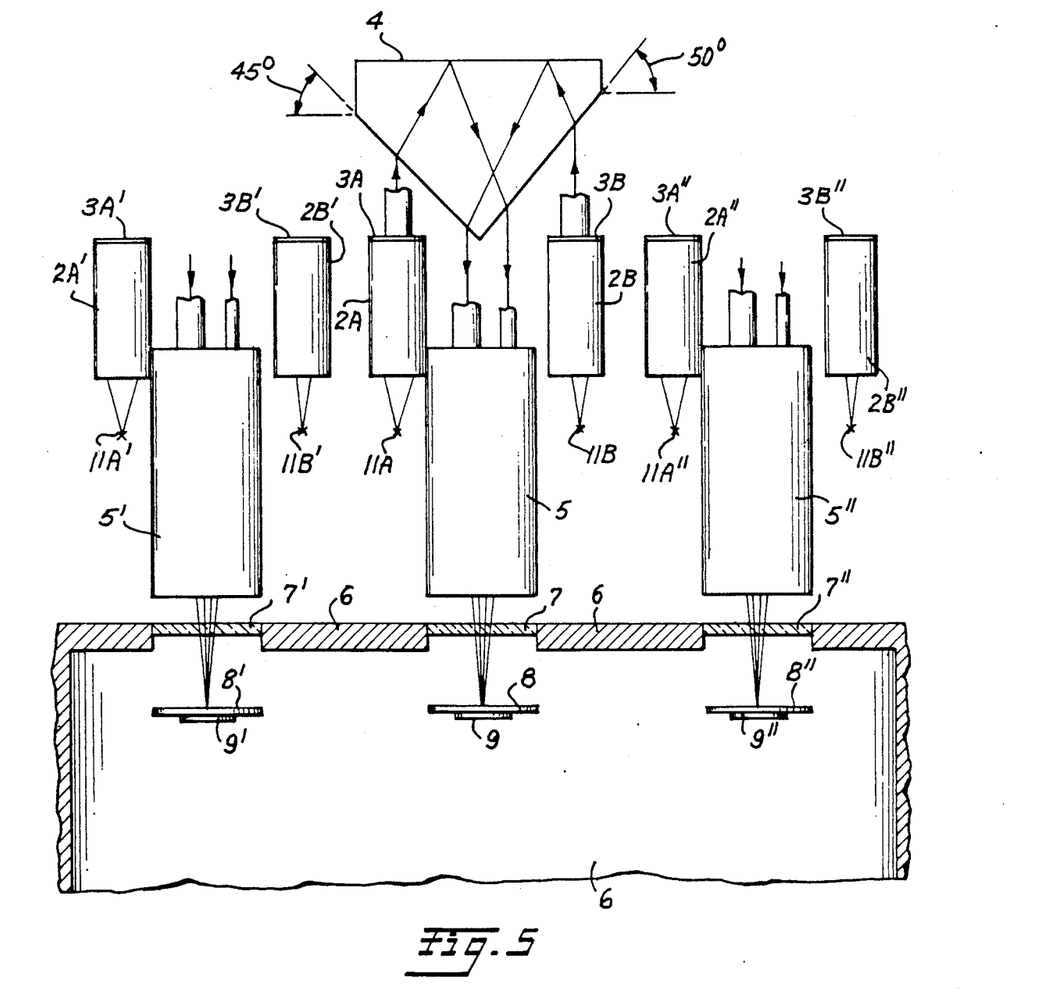
FIG. 5 illustrates an alternative construction for packaging the light optics of the system shown in FIG. 4 to provide it with small enough diameter to be used in a multiple electron beam system similar to that of FIG. 4, but which uses "folded" optics.

FIG. 5 illustrates an alternative embodiment of a multi-electron beam column lithography system according to the invention wherein the packaging of the light optical system employs "folded" optical elements in order to include all of the required elements of the system in a minimum size package. Design of the prism element 4 with the details illustrated in FIG. 5 will provide the desired offset of the light images at the target plane of the multi-electron beam lithography system.

INDUSTRIAL APPLICABILITY

The invention provides a light switched electron beam source employing a common photo-emitter cathode and at least two light emitting sources of monochromatic light comprised by laser diodes or light emitting diodes and the like. The novel light switched electron beam source can be used in either single column or multi-column electron beam lithography systems to increase their rate of writing pixels in an integrated circuit pattern.

Having described several embodiments of a new and improved light switched electron beam source employing a common photo-emitter cathode and at least two laser diodes or light emitting diodes according to the invention, it is believed obvious that other modifications and variations of the invention will be suggested to those skilled in the art in the light of the above teachings. It is therefore to be understood that changes may be made in the particular embodiments of the invention described which are within the full intended scope of the invention as defined by the appended claims.

What is claimed is:

1. A light switched electron beam source employing a common photo-emitter cathode comprising:
   at least two light emitting sources of monochromatic light;
   light optical collimating and image sharpening means in the path of the light image projected by the respective light emitting sources for sharpening the edges of the light images projected by the sources;
   light path diverting means supplied with the light output from the collimating and image sharpening means for diverting the path of the light images from the respective light emitting sources onto a common path; and
   photo-emitting cathode means positioned in the common path for selective excitation by the respective light emitting sources.

2. A switched electron beam source employing a common photo-emitter cathode according to claim 1 further including common control means for selectively switching the respective light emitting sources of monochromatic light on and off.

3. A switched electron beam source employing a common photo-emitter cathode according to claim 1 wherein the light emitting sources are light emitting diodes, diode lasers for emitting a finely focused pencil-like beam of monochromatic light.

4. A switched electron beam source employing a common photo-emitter cathode according to claim 2 wherein the light emitting sources are light emitting diodes, diode lasers for emitting a finely focused pencil-like beam of monochromatic light.

5. A switched electron beam source employing a common photo-emitter cathode according to claim 4 wherein the light optical collimating and image sharpening means comprises a light collimator lens and aperture optical sub-system.

6. A switched electron beam source employing a common photo-emitter cathode according to claim 5 wherein the light emitting sources are designed to emit light beams which are linear-shaped in cross section and which are oriented at right angles to each other and the apertures in the respective light collimator lens and aperture optical sub-system are similarly oriented to correspond to the linear light beam orientation of the respective light sources whereby one light beam has its elongated linear axis oriented to extend vertically and the remaining light beam extends in a horizontal pattern in the plane of a target being acted on by the photo-emitting cathode means.

7. A switched electron beam source employing a common photo-emitter cathode according to claim 6 wherein the axes of the emitted light beam paths are displaced a finite distance apart relative to each other so as to separate the images of the two beams a finite distance apart in the plane of the photo-emitting cathode means to avoid stray light from one light beam from spilling over into the other beam and causing deterioration of the beam edge sharpness.

8. A switched electron beam source according to claim 1 wherein the light diverting means comprises a prism, a mirror system.

9. A switched electron beam source according to claim 7 wherein the light diverting means comprises a prism, a mirror system.

10. A switched electron beam source employing a common photo-emitter cathode according to claim 1 further including light focusing lens systems interposed in the light path between the light path diverting means and the photo-emitting cathode means for focusing respective light images onto the surface of the photo-emissive cathode.

11. A switched electron beam source employing a common photo-emitter cathode according to claim 9 further including light focusing lens systems interposed in the light path between the light path diverting means and the photo-emitting cathode means for focusing respective light images onto the surface of the photo-emissive cathode.

12. A switched electron beam source employing a common photo-emitter cathode according to claim 1 wherein the photo-emitting cathode means comprises a photo-emissive film supported on a light transparent substrate and the photo-cathode surface itself is patterned to expose one photo-emissive surface geometry corresponding to each light emitting source.

13. A switched electron beam source employing a common photo-emitter cathode according to claim 12 wherein the photo-emissive surface geometries are in the form of horizontal and vertical lines corresponding in orientation to the orientation of the impinging linear light beam.

14. A switched electron beam source employing a common photo-emitter cathode according to claim 11 wherein the photo-emitting cathode means comprises a photo-emissive film supported on a light transparent substrate and the photo-cathode surface itself is patterned to expose photo-emissive surfaces in the form of horizontal and vertical lines corresponding in orientation to the orientation of the impinging linear light beam whereby the photo-emissive cathode functions as a switchable, sharply apertured source.

15. A switched electron beam source employing a common photo-emitter cathode according to claim 1 wherein the photo-emitting cathode means further includes electron beam aperture means and electron beam selection deflection means for further controlling the width and length and sharpness of the electron writing beam produced by the light switched electron beam source.

16. A switched electron beam source employing a common photo-emitter cathode according to claim 14 wherein the photo-emitting cathode means further includes electron beam aperture means and electron beam selection deflection means for controlling the width and length and sharpness of the electron writing beam produced by the light switched electron beam source.

17. A switched electron beam source employing a common photo-emitter cathode according to claim 1 further including electron beam focusing and beam spot placement deflection electron optical means for controlling the writing action of the electron beam spot in the plane of a workpiece.

18. A switched electron beam source employing a common photo-emitter cathode according to claim 16 further including electron beam focusing and beam spot placement deflection electron optical means for controlling the writing action of the electron beam spot in the plane of a workpiece.

19. A multi-electron beam column lithography system employing a plurality of light switched electron beam sources wherein each electron beam optical column in the multi-electron beam column system has its own respective light switched electron beam source, each of said sources comprising:

at least two light emitting sources of monochromatic light;

light optical collimating and image sharpening means in the path of the light image projected by the respective light emitting sources for sharpening the edges of the light images projected by the sources;

light path diverting means supplied with the light output from the collimating and image sharpening means for diverting the path of the light images from the respective light emitting sources onto a common path; and photo-emitting cathode means positioned in the common path for selective excitation by the respective light emitting sources.

20. A multi-electron beam column lithography system employing a plurality of light switched electron beam sources wherein each electron beam column system has its own respective light switched electron beam source, each said source comprising:

at least two light emitting sources of monochromatic light;

light optical collimating and image sharpening means in the path of the light image projected by the respective light emitting sources for sharpening the edges of the light images projected by the sources;

light path diverting means supplied with the light output from the collimating and image sharpening means for diverting the path of the light images from the respective light emitting sources onto a common path;

photo-emitting cathode means positioned in the common path for selective excitation by the respective light emitting sources;

common control means for selectively switching the respective light emitting sources of monochromatic light on and off;

light focusing lens systems interposed in the light path between the light path diverting means and the photo-emitting cathode means for focusing respective light images onto the surface of the photo-emissive cathode;

electron beam aperture means and electron beam selection deflection means for controlling the width and length and sharpness of the electron writing beam produced by the light switched photo-emitting cathode means; and electron beam focusing and beam spot placement deflection electron optical means for controlling the writing action of the electron beam spot produced by the electron writing beam in the plane of a workpiece; and wherein the light emitting sources are light emitting diodes or diode lasers for emitting a finely focused pencil-like beam of monochromatic light;

the light optical collimating and image sharpening means comprises a light collimator lens and aperture optical sub-system;

the light emitting sources are designed to emit light beams which are linear-shaped in cross section and which are oriented at right angles to each other and the apertures in the respective light collimator lens and aperture optical sub-system are similarly oriented to correspond to the linear light beam orientation of the respective light sources whereby one light beam has its elongated linear axis oriented to extend vertically and the remaining light beam extends in a horizontal pattern in the plane of a target being acted on by the photo-emitting cathode means;

the axes of the emitted light beam paths are displaced a finite distance apart relative to each other so as to separate the images of the two beams a finite distance apart in the plane of the photo-emitting cathode means to avoid stray light from one light beam from spilling over into the other beam and causing deterioration of the beam edge sharpness;

the light diverting means comprises a prism or a mirror system; and the photo-emitting cathode means comprises a photo-emissive film supported on a light transparent substrate and the photo-cathode surface itself is patterned to expose photo-emissive surfaces in the form of horizontal and vertical lines corresponding in orientation to the orientation of the impinging linear light beam whereby the photo-emissive cathode functions as a switchable, sharply apertured source.

21. The method of producing different shapes and orientations of electron beam cross-sectional patterns emitted from a photo-cathode excited by a diode laser light for use in electron beam lithography and the like employing at least two finely focused, pencil-like light beam sources of monochromatic light and a common photo-emissive cathode surface:

said method comprising selectively exciting the respective light beam sources, collimating and shaping the respective light beams, bending and diverting the respective collimated and shaped light beams from the respective sources onto a common light path, directing the collimated, shaped and diverted light beams travelling along the common path onto the common photo-emissive cathode surface located in the common light path, and utilizing the shaped electron beam emitted from the photo-emissive cathode to perform electron beam lithography.

* * * * *